United States Patent [19]
Ikeya

[11] Patent Number: 5,462,446
[45] Date of Patent: Oct. 31, 1995

[54] SOCKET APPARATUS

[75] Inventor: Kiyokazu Ikeya, Shizuoka, Japan

[73] Assignee: Texas Instruments Incorporated, Dallas, Tex.

[21] Appl. No.: 278,521

[22] Filed: Jul. 20, 1994

[30] Foreign Application Priority Data

Aug. 6, 1993 [JP] Japan .................... 5-215216

[51] Int. Cl.⁶ .................... H01R 13/62
[52] U.S. Cl. .................... 439/264; 439/330
[58] Field of Search .................... 439/259, 260, 439/261, 262, 263, 264, 266, 267, 268, 269, 330, 331, 71–73

[56] References Cited

U.S. PATENT DOCUMENTS

| 4,189,199 | 2/1980 | Grau | 439/264 |
|---|---|---|---|
| 4,461,525 | 7/1984 | Griffin | 439/368 |
| 4,721,477 | 1/1988 | Lotter | 439/330 |
| 4,789,345 | 12/1988 | Carter | 439/330 |

*Primary Examiner*—Gary F. Paumen
*Assistant Examiner*—Hien D. Vu
*Attorney, Agent, or Firm*—Russell E. Baumann; Richard L. Donaldson; René E. Grossman

[57] ABSTRACT

Generally U-shaped contact elements (11) mounted in a socket body (2) each has a flexible portion (13), a generally U-shaped bent portion (14) which bends approximately 180° and a contact portion (15). A head (31) which supports an IC package (21) moves toward the main socket body (2) to mount the IC package (21) in socket (1). Immediately before reaching the mounting position of the IC package, an arm (9) of a lever (7), rotatably journaled in the socket body (2), is pushed by head (31) rotating lever (7). Arm (10) of lever (7), sandwiched between the contact flexible portion (13) and the lower end of the contact portion (15), rotates therewith pressing contact portions (15) against leads (26) of the IC package, thereby effecting an electric connection between the two.

12 Claims, 14 Drawing Sheets

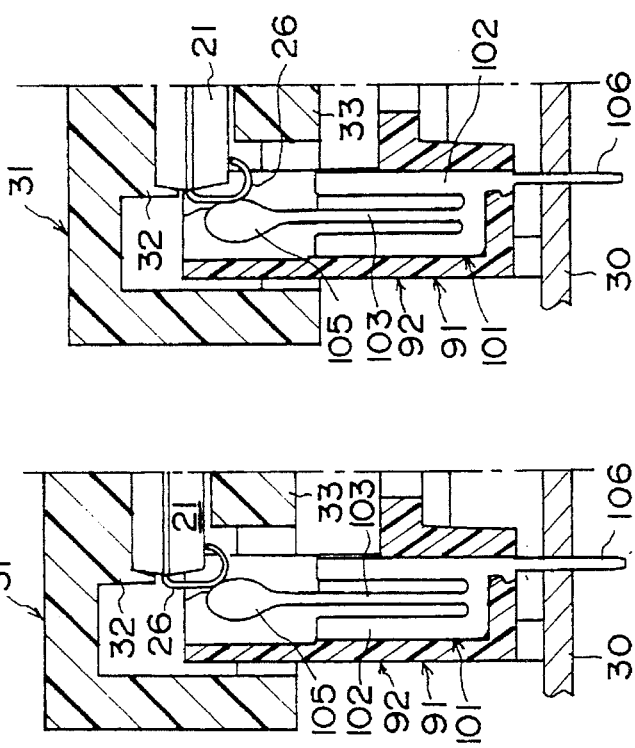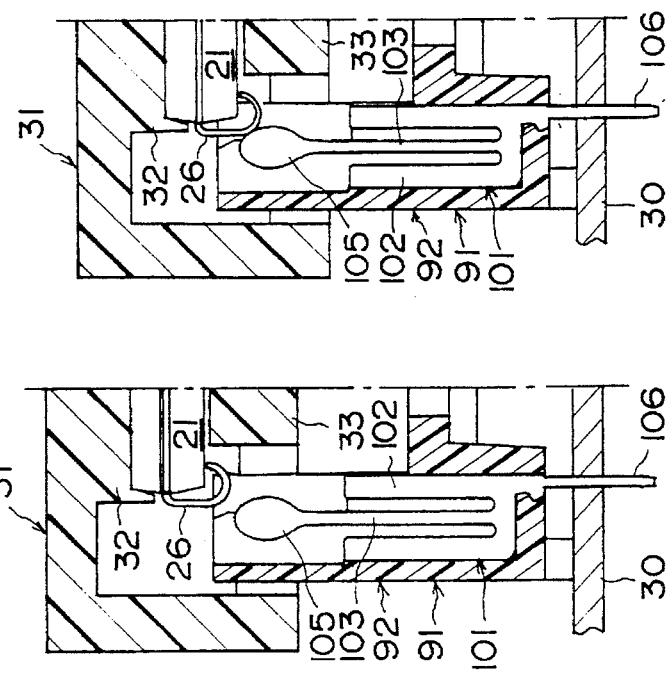

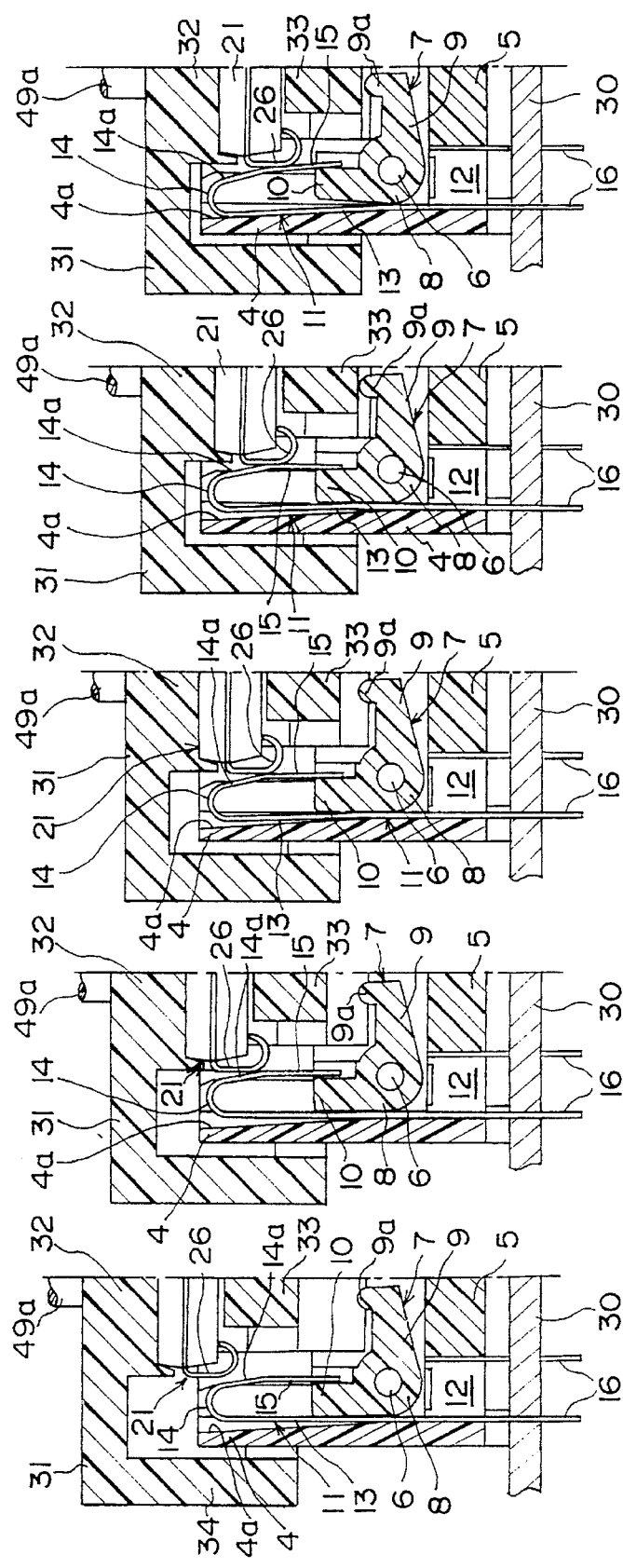

SOCKET APPARATUS

BACKGROUND OF THE INVENTION

This invention relates generally to a socket having means to make electrical connection with leads of an electronic device received in the socket and more specifically to a socket having electrical contact elements which, in connection with the insertion of a semiconductor integrated circuit package (which will hereafter be referred to as an IC package), makes electrical contact by biasing the contact elements against leads of the IC package and to a socket which is suitable for IC package testing, in particular, electrical property testing.

A conventional socket for use in test apparatus for testing various electrical properties of an IC package is shown in FIG. 1. Contacts 101 are fixedly mounted on both sides of a main socket body 92. A fixed body portion 102 of each contact 101 has a U-shape with a bar shaped flexible portion 103 extending upwardly from the center of the body portion thereof. A wide contact portion 105 is provided at the tip of flexible portion 103 for engagement with a lead of an IC package. A terminal leg 106 protrudes from the lower side of the fixed body portion 102 and extends through the bottom wall of main socket body 92 and is received through a bore of a printed circuit substrate (PCB) 30 of the test apparatus (not shown in the drawing) to fixedly mount socket 91 to PCB 30.

IC package 21 has generally J-shaped leads 26 on both right and left sides as seen in the figure, and is supported by a head 31 which has been provided in the test apparatus in such a manner as to be able to move in alternating opposite directions. IC package 21 is mounted in main socket body 92, as shown in the figure, as a result of forward movement of head 31.

In this position, leads 26 push contact portions 105 of contacts 101 outwardly toward the right and left sides respectively. As the flexible portions 103 of the contacts are elastically deformed, the contact portions 105 press against leads 26 by the spring return force thereby making an electric connection. In this manner, leads 26 of IC package 21 are connected to a prescribed electrical circuit in the test apparatus through contacts 101 and PCB 30.

The procedural steps for mounting the IC package in the socket are shown in FIGS. 2(a)–2(d) with only the left side being shown as a cross section since both sides are symmetrical. FIG. 2(a) shows the socket prior to mounting the IC package in the socket. FIG. 2(b) shows the structure when the lead of the IC package has just engaged the contact portion; FIG. 2(c) shows the structure when the contact portion 105 slides on the lead of the IC package and FIG. 2(d) shows the structure when the IC package is fully mounted in the socket as head 31 has reached the prescribed mounting position.

Going from FIG. 2(a) to FIG. 2(b) there is no bending of the contact flexible portion 103, with contact portion 105 exerting no force against lead 26. Going between the FIGS. 2(b) and 2(c) positions, the flexible portion 103 is bent with contact portion 105 pressing against the lead 26 and this pressing force increasing from zero in FIG. 2(b) to a prescribed pressing force shown in FIG. 2(c). Going between the FIGS. 2(c) and 2(d) positions, the pressing force remains constant at the prescribed level.

The IC package has its electrical properties tested in the position shown in FIG. 1 and FIG. 2(d). The time required for testing one IC package is in the range between several seconds to a minute. The IC package is mounted in the socket, tested and removed from the socket to make place for the next IC package to be mounted in the socket for testing.

The socket according to the prior art was designed for use in a heat resistance test of the IC package. In this test, called a burn-in test, the package is heated and held in the mounted state at a prescribed temperature for a selected period of time and its electrical properties are tested. Contact force between respective contacts and leads is high for electrical property testing and, in view of the fact that there are a very large number of repetitions of the mounting and dismounting of IC packages in such electrical property testing, a small amount of solder which peels off the solder-plated layer of the lead of the IC package accumulates on the contact portion. This accumulation tends to adhere to the lead of a subsequent IC package received in the test apparatus, thereby contributing toward the lowering of product quality. In addition, flexible portion 103 of the contact tends to loose its spring contact force, thereby creating a problem in terms of the durability of the socket.

It is an object of the invention to provide a socket which overcomes the noted deficiencies of the prior art and which obtains the desired level of contact force of the contact elements against the leads of the electronic device when the mounting of the electronic device is completed, which decreases sliding of the contact elements against leads at a time when the required high level pressing force is maintained, prevents the lowering of the product quality of the electrical part stemming from this pressing force and which has improved durability.

Briefly, in accordance with the invention, a socket comprises contact elements which are electrically connectable, when in a compressed state, to respective electrical parts, such as the leads of an IC package mounted in the socket, and an operating member which has been movably mounted on the main body of the socket in such a way as to operate by pressing the contact elements against the respective electrical parts at the completion of the mounting of the electrical part in the socket.

According to a feature of the invention, at the time of mounting of the electrical part by the electrical part mounting means (such as, for example, head 31 which will be described later) the operating member presses the contact elements in dependence upon the movement of the electrical part mounting means.

According to another feature of the invention, the electrical connection between the contact elements and the electrical parts are effected by flexibly bending the contact elements by the pressing of the operating member which is journaled on the main body of the socket in such a manner as to be freely rotatable, one end of the operating member being engaged by the electrical part mounting means and the other end of the operating member pressing a contact element.

According to yet another feature of the invention, each contact element is bent back into a generally U-shaped configuration. The electrical part is inserted at a prescribed position aligned with a position between the bight of the U-shaped contact element and one free end thereof, the other end of the contact element being fixed to the main body of the socket. The free end of the contact element is engaged with the operating member, and the electrical part is compressively engaged by a respective contact element proximate to the engagement location.

Preferably, according to the invention, a plurality of the combinations of the operating member and the contact elements are provided in the main socket body in such a way as to face each other, with the electrical part being mounted between the plurality of combinations.

The socket made in accordance with the invention is such that the electrical part mounting means is provided on the electrical part testing apparatus and is capable of moving in alternating opposite directions relative to the main body of the socket and is preferably used as a socket for the electrical part test apparatus.

Various additional objects and advantages of the present invention will become apparent from the following detailed description and the accompanying drawings.

BRIEF DESCRIPTION OF THE DRAWINGS

FIGS. 2(a)–2(d) are cross sectional views of the left side of the FIG. 1 structure, reduced in size, showing several stages in the mounting procedure;

FIGS. 3(A)–3(E) are cross sectional views similar to FIGS. 2(a)–2(d) showing several stages of the IC package mounting procedure in a socket made in accordance with a first embodiment of the invention;

DETAILED DESCRIPTION OF THE PREFERRED EMBODIMENTS

Turning now to the drawings, FIGS. 3–13 relate to a first embodiment of the invention comprising a socket adapted to mount an IC package called the SOJ type having approximately J-shaped leads on two mutually opposed sides.

Figure 7:
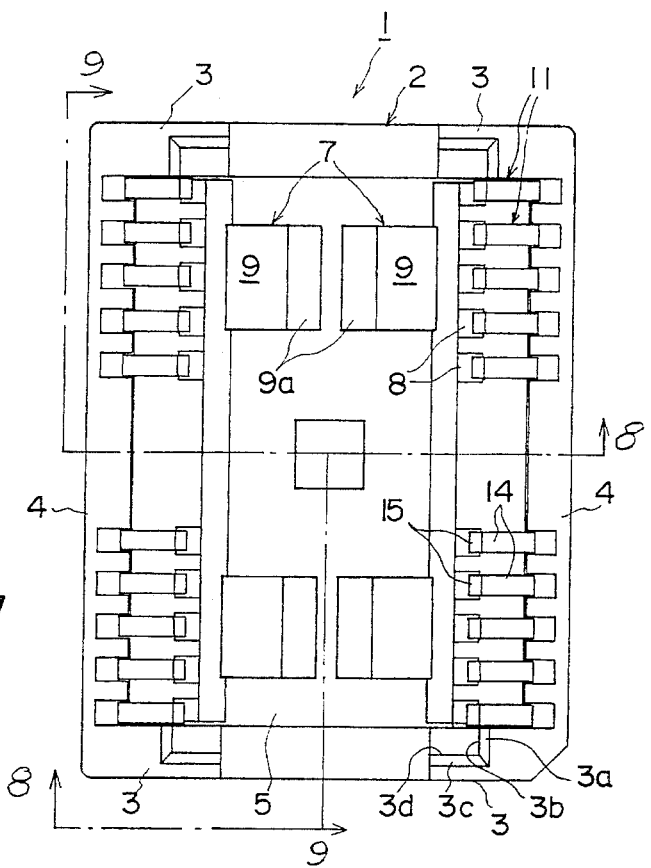
FIG. 7 is a top plan view of the FIGS. 5, 6 socket.
Figure 8:
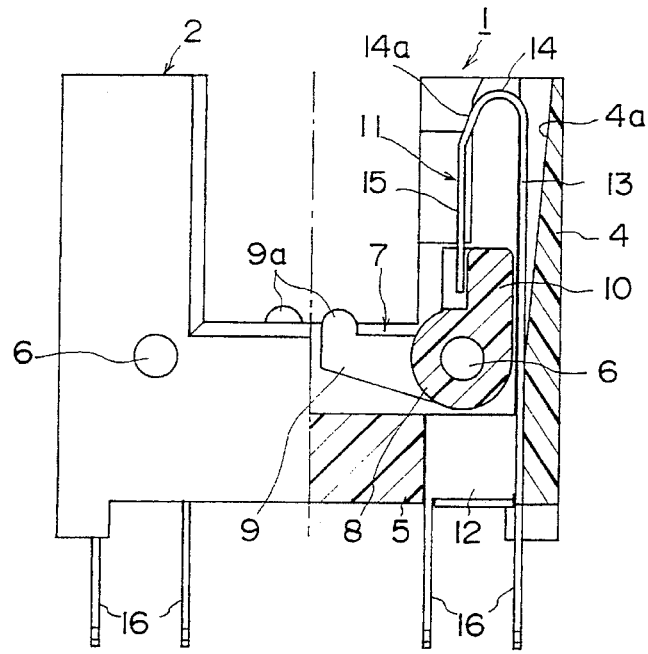
FIG. 8 is a partial cross sectional view taken along line 8—8 in FIG. 7.
Figure 9:
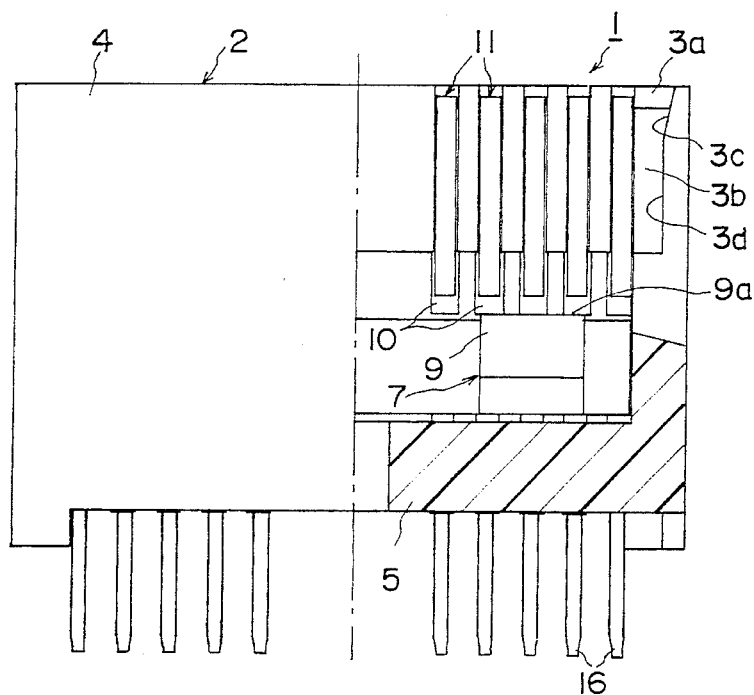
FIG. 9 is a partial cross sectional view taken along line 9—9 in FIG. 7.
Figure 10:
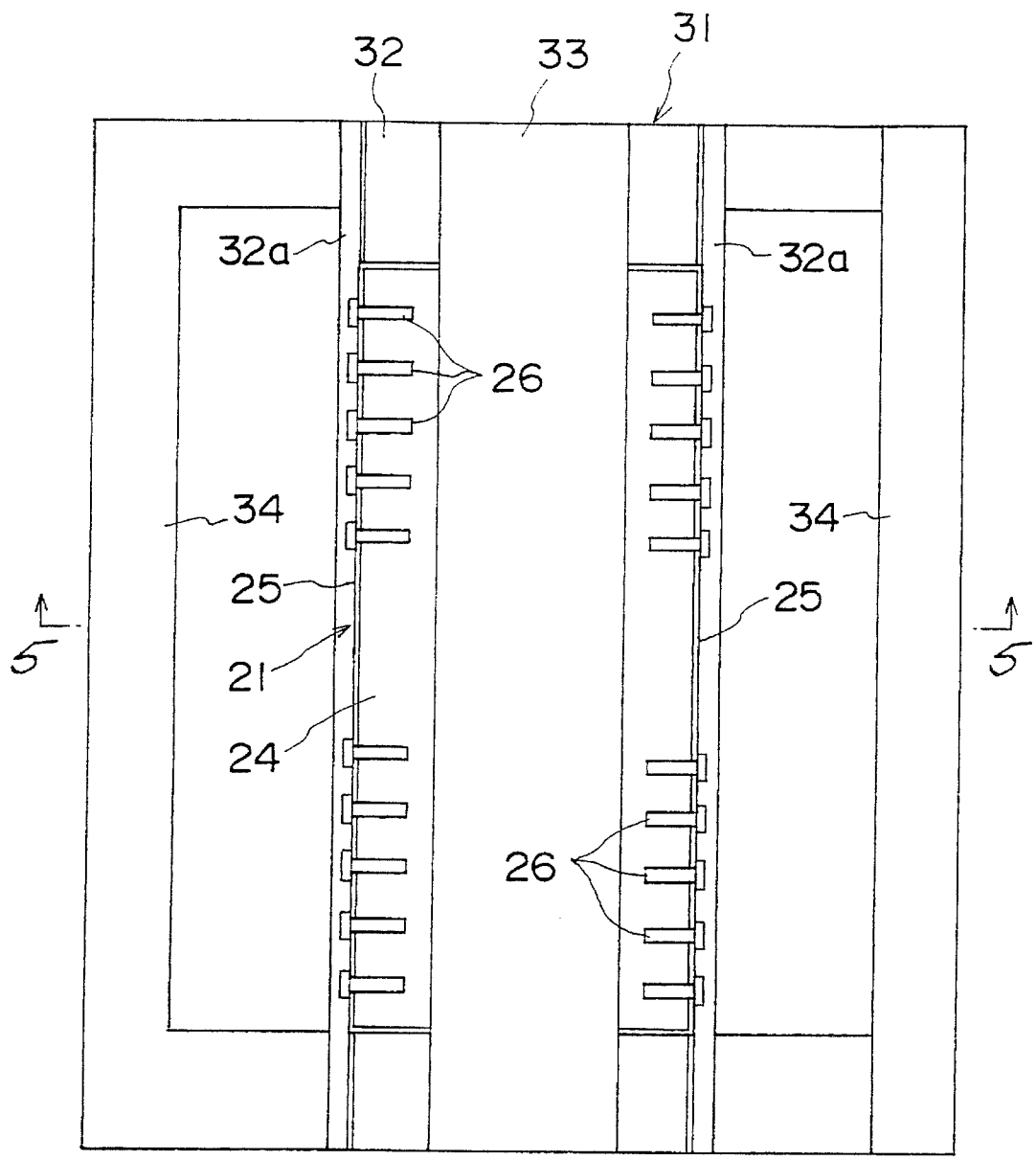
FIG. 10 is a bottom plan view of the head and IC package taken along line 10—10 in FIG. 5.
Figure 11:
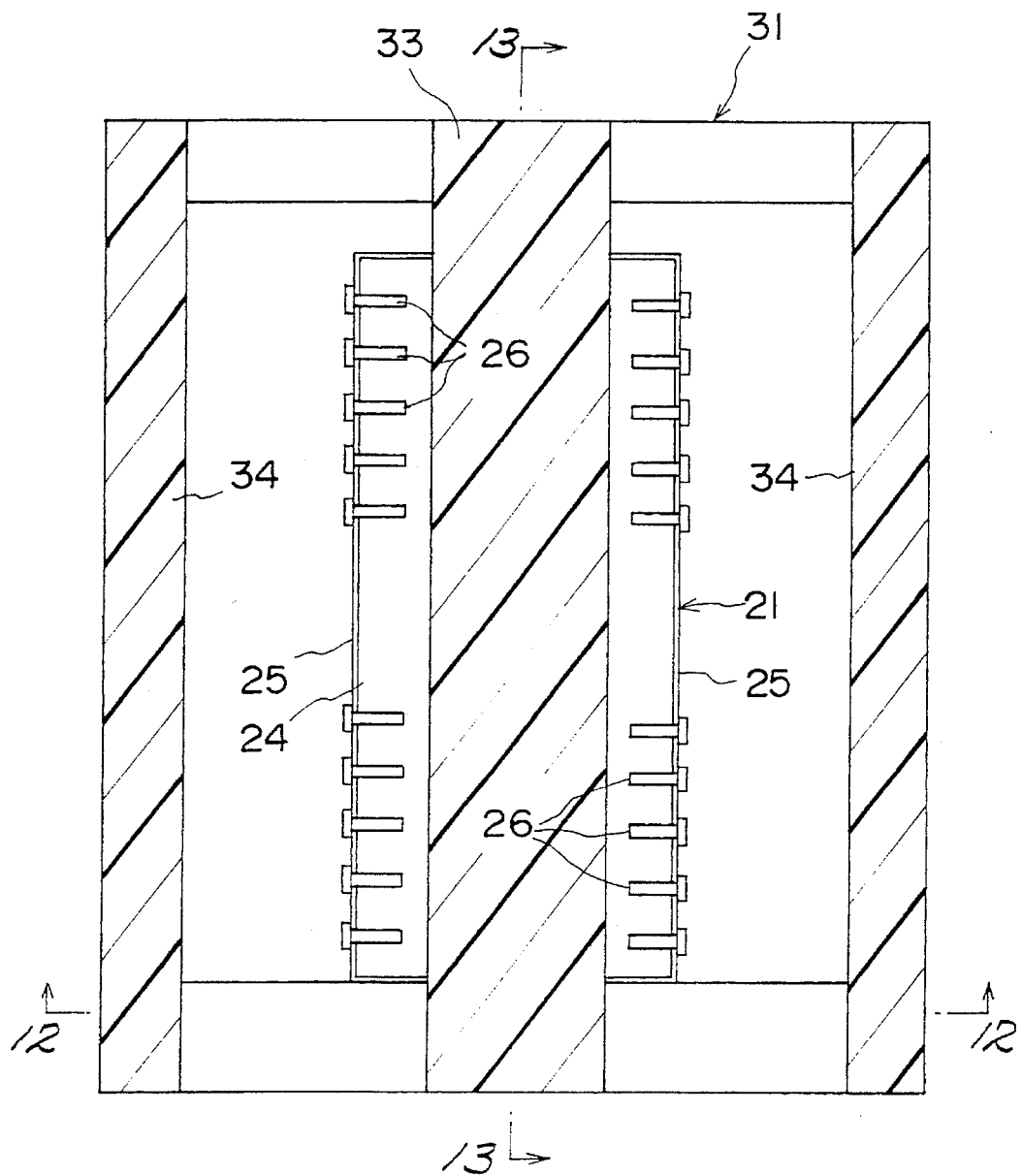
FIG. 11 is a cross sectional view of the head taken along line 11—11 in FIG. 12.
Figure 12:
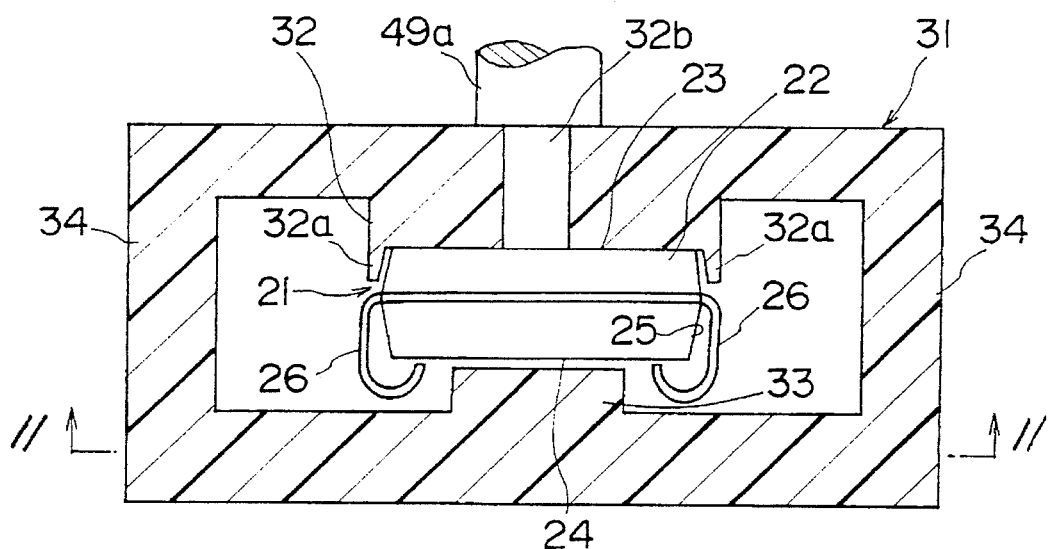
FIG. 12 is a cross sectional view taken along line 12—12 in FIG. 11.
Figure 13:
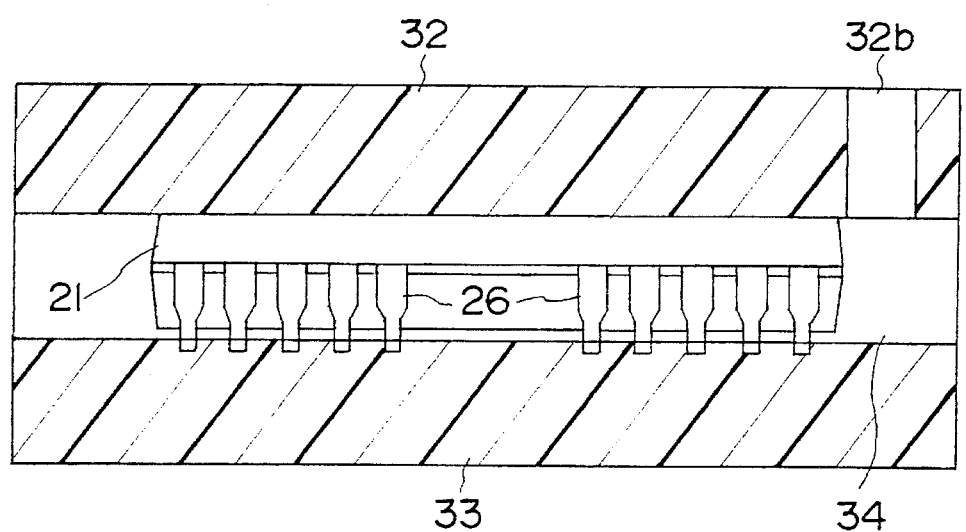
FIG. 13 is a cross sectional view taken along line 13—13 in FIG. 11.

With reference to FIGS. 7–9, sloped guide surfaces 3a and 3c are formed at each corner on two mutually opposed sidewalls 3 of the main body 2 of socket 1, for guiding an IC package inserted therein to vertical surfaces 3b and 3d for positioning the IC package. Levers 7 are freely rotatably journaled by the axes 6 on the sidewalls 3. Each lever is generally L-shaped in a cross section taken perpendicular to axis 6 with inner arm 9 of the lever extending toward the center of the socket body 2 and having a protuberance 9a at its distal free end adapted to engage head 31 as will be described below. A plurality of spaced arms 10 of lever 7 face upwardly aligned with contact elements 11 which will be described below.

The base portion 12 of each contact element 11 is fixedly mounted in the bottom wall 5 of the main socket body 2. A strip shaped flexible portion 13 extends upwardly from base portion 12, with the flexible portion 13 being bent 180° into a U-shaped configuration having a bight portion 14 with the free distal end serving as a contact portion 15 adapted to engage a respective lead of the IC package.

An inclined part 14a forming an oblique angle with contact portion 15 is formed at bight portion 14 which initially engages a respective lead of the IC package when the IC package is inserted. A terminal leg portion 16 extends downwardly from the base portion 12 of the contact element. Contact elements 11 are arranged at symmetrical positions on both sides of the main socket body 2. Arm 10 of lever 7 is inserted between the flexible portion 13 of the contact element and the free end thereof, contact portion 15.

On the upper side of the outer opposing sidewalls 4 of the main socket body 2, an inclined surface 4a is formed to provide space for the flexible bending of the flexible portion 13 of the contact element.

Figure 5:
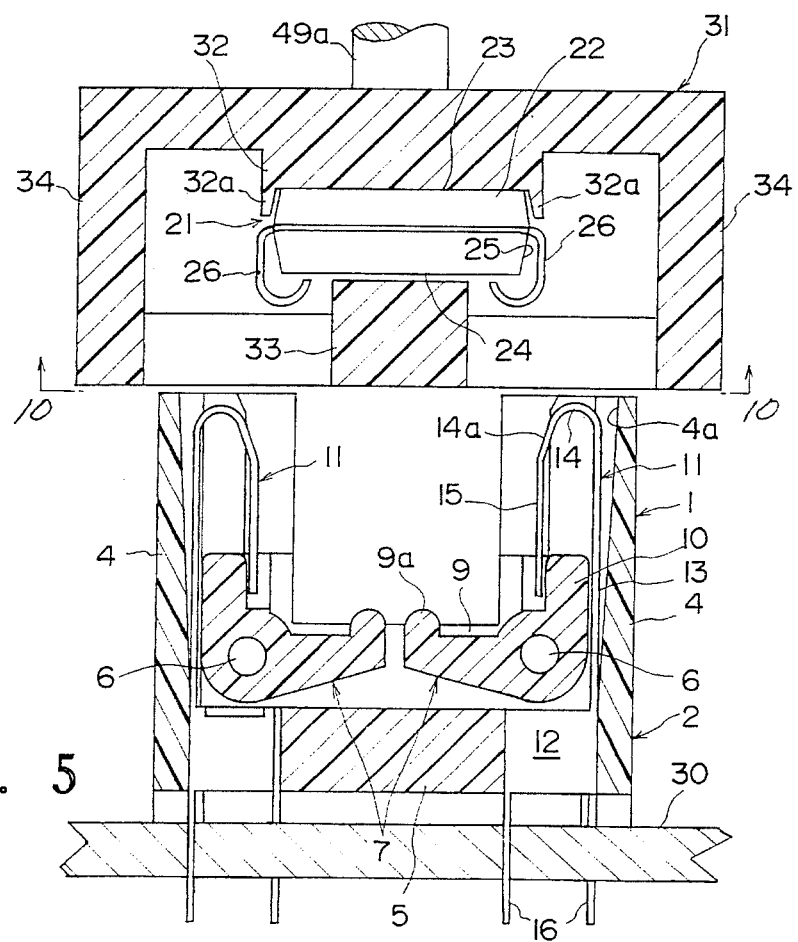
FIG. 5 is a cross sectional view, similar to FIG. 1, of a socket made in accordance with the invention and an associated head prior to the mounting of the IC package in the socket, the view of the head taken along line 5—5 in FIG. 10.
Figure 14:
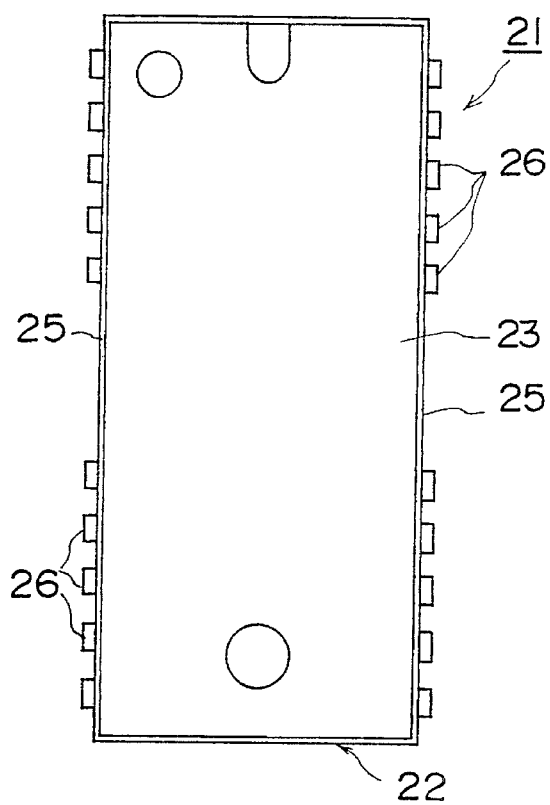
FIG. 14 is a top plan view of an IC package of the SOJ type.
Figure 15:
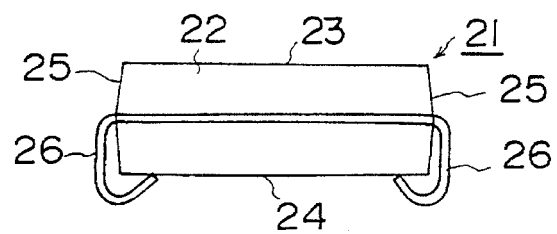
FIG. 15 is a front end view of the FIG. 14 IC package.
Figure 16:
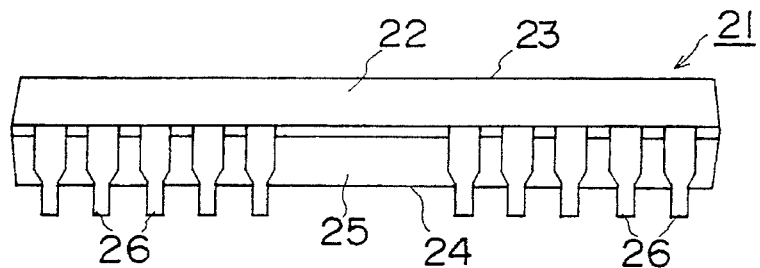
FIG. 16 is a side view of the FIGS. 14, 15 IC package.

With reference to FIGS. 14–16, a plurality of leads 26, ten leads in this example, approximately in the shape of a J, are provided in IC package 21 along each side surface 25 of the main body 22 facing each other. The IC package 21 is mounted in socket 1 as shown in FIGS. 5 and 6.

Figure 17:
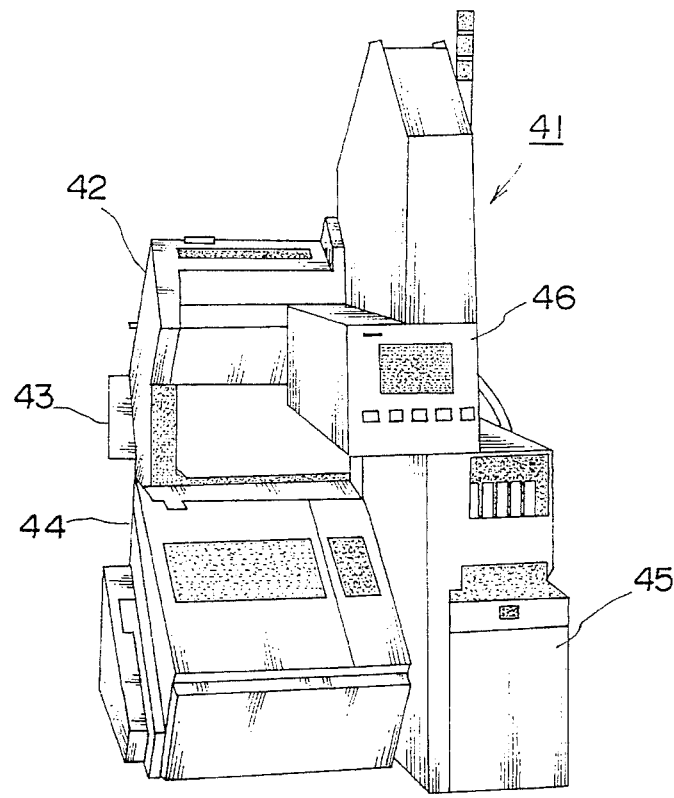
FIG. 17 is a perspective view of an IC package testing apparatus.

IC package 21 is supported by an IC package support member, head 31, an appurtenance of the test apparatus 41 (FIG. 17). Head 31 has a first support boss 32 equipped with a pair of rails 32a for positioning the IC package and a second support boss 33 spaced from and facing the former. Both support bosses 32 and 33 extend along the longitudinal direction of the head. IC package 21 is inserted in a seat between support bosses 32 and 33, with the upper surface 23 of the main body 22 facing support boss 32 and the lower surface 24 of the main body 22 facing support boss 33.

Figure 6:
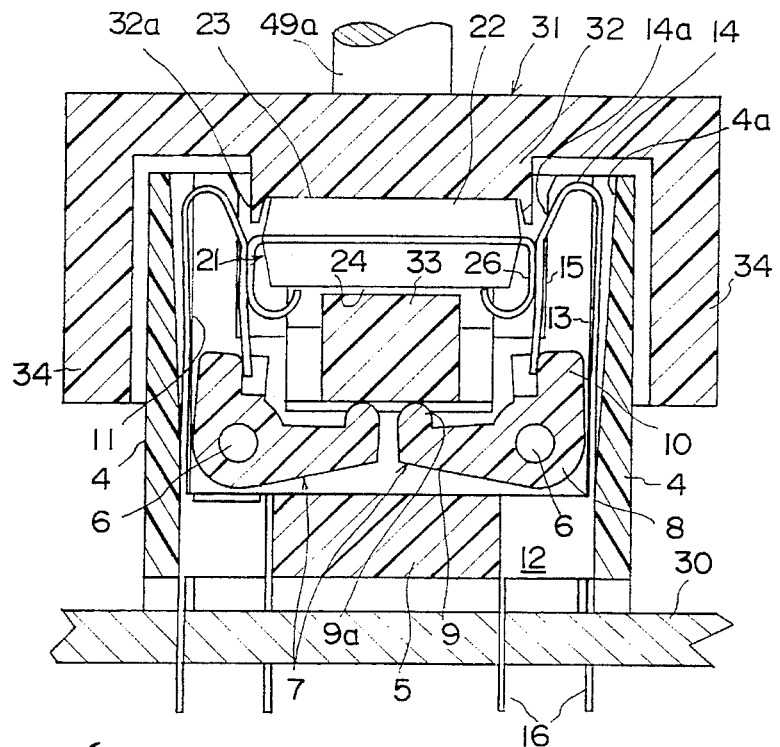
FIG. 6 is a cross sectional view, similar to FIG. 5, of the socket and head after mounting of the IC package has been completed.

As shown in FIG. 6, head 31 moves toward main socket body 2 in such a fashion that the sidewalls 34 of head 31 sandwich the sidewalls 4 of the main socket body 2, with the result that IC package 21 is inserted into the main socket body 2. Socket 1 is fixed to the printed circuit substrate (PCB) 30 via terminals 16.

In this position, support boss 33 on the lower side of head 31 engages protuberances 9a at the tip of arms 9 of the levers, thereby pushing them downwardly as seen in the Figure. Because of this, arms 10 of levers 7 pivot toward the interior of the main socket body, thereby pushing the contact portions 15 of the contact elements 11 against the side of the IC package 21.

In other words, the position of levers 7 is dependent upon movement of head 31 and, at the same time, the levers function as a cam for contact elements 11. Because of this, contact portions 15 press leads 26 of the IC package, thereby effecting an electrical connection between the two. In this position, the flexible portions 13 of the contact elements 11 are flexibly bent so as to approach the inclined surface 4a of sidewalls 4 of the main socket body. Together with the contact elements spring return force, the pressure of the contact elements due to the levers assures electrical connection between respective contact elements and leads. In this position, IC package 21 is mounted in the socket and ready for testing.

With reference to FIGS. 10–13, numeral 32b (FIG. 12) indicates a through hole that has been provided on the upper support boss 32 which cooperates with a pin (pin 50a in FIGS. 19–21) which is receivable in hole 32b and serves as a stop member for the IC package which will be described later.

FIGS. 3(A) through 3(E) are cross sectional views showing several stages leading from the IC package loading position shown in FIG. 5 to the IC package mounted position shown in FIG. 6. FIG. 3(A) shows the position shown in FIG. 5 and FIG. 3(E) shows the position shown in FIG. 6. In FIG. 3(B), head 31 has moved from the position shown in FIG. 3(A) toward the main socket body 2 and is shown at the instant when leads 26 of package 21 have engaged the inclined portion 14a of respective contact elements 11. As the head moves further, leads 26 pass the inclined contact portions 14a and engage the top of the contact portion 15 as is shown in FIG. 3(C). When head 31 moves further, the lower surface of the lower support boss 33 of head 30 engages protuberances 9a of levers 7 as is shown in FIG. 3(D). When the head moves still further, arms 9 of levers 7 are pushed by support boss 33 of head 31 and, as is shown in FIG. 3(E), arms 10 of levers 7 pivot, with a result that a respective contact element 11 and lead 26 are electrically firmly engaged as has been explained in connection with FIG. 6.

Figure 4:
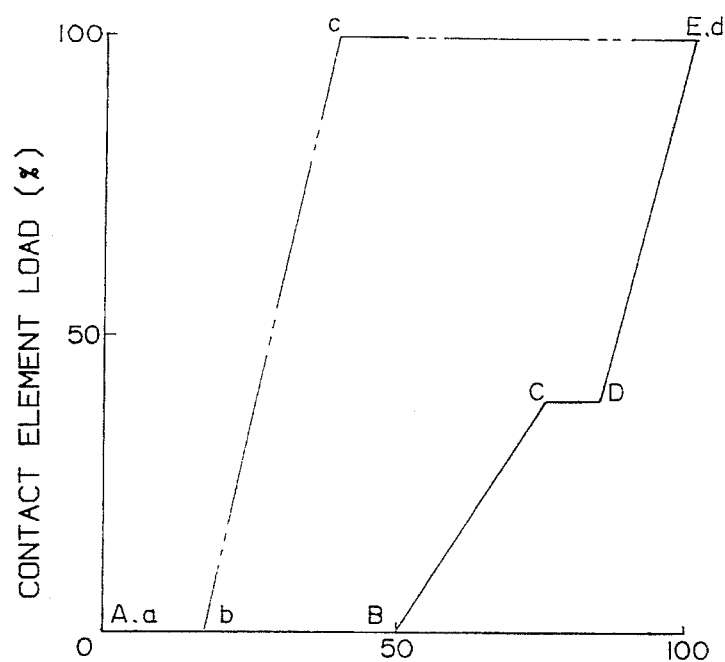
FIG. 4 is a graph showing the travel of the IC package and the contact load of a contact element against a respective lead (solid line) in comparison with the FIG. 1 prior art example (dashed line)

The change in the contact load of lead 26 and contact element 11 from FIG. 3(A) to FIG. 3(E) is shown by the solid line in FIG. 4 with A to E representing the load at the respective stages shown in FIGS. 3(A) to 3(E). In FIG. 4, moreover, indications are made in relative percentage by using the contact load and the distance of movement or travel of the IC package at the completion of the IC package mounting as 100 percent.

The contact pressure in the stages from FIGS. 3(A) to 3(B) is zero. In the stages from FIGS. 3(B) to 3(C), the contact pressure rises to approximately 40 percent of the final load and, in the stages from FIGS. 3(C) to 3(D), the contact pressure is maintained approximately constant at 40 percent due to the fact that the leads 26 merely brush the contact portion 15. In the stages between FIGS. 3(D) and 3(E), where the contact portions 15 press respective leads 26 as they are pushed by arm 10 of lever 7, the contact pressure rises from approximately 40 percent to 100 percent at the completion of mounting.

Thus, it will be seen that the necessary contact pressure is obtained for the first time essentially at the completion of mounting and this required contact pressure is not dependent upon the spring return force of the contact elements but is mainly effected by the rotation of lever 7, with a result that the stress on the contact elements is mitigated. With the effect of the spring return force of the contact elements being added, the contact pressure of the contact elements and the leads become sufficient, so that electrical engagement between respective pairs becomes assured.

It will also be noted that since the pressing force of the contact elements due to the rotation of lever 7 and the pressing force of the contact elements 11 against respective leads 26 are in the same direction, the mechanism is simple.

Figure 1:
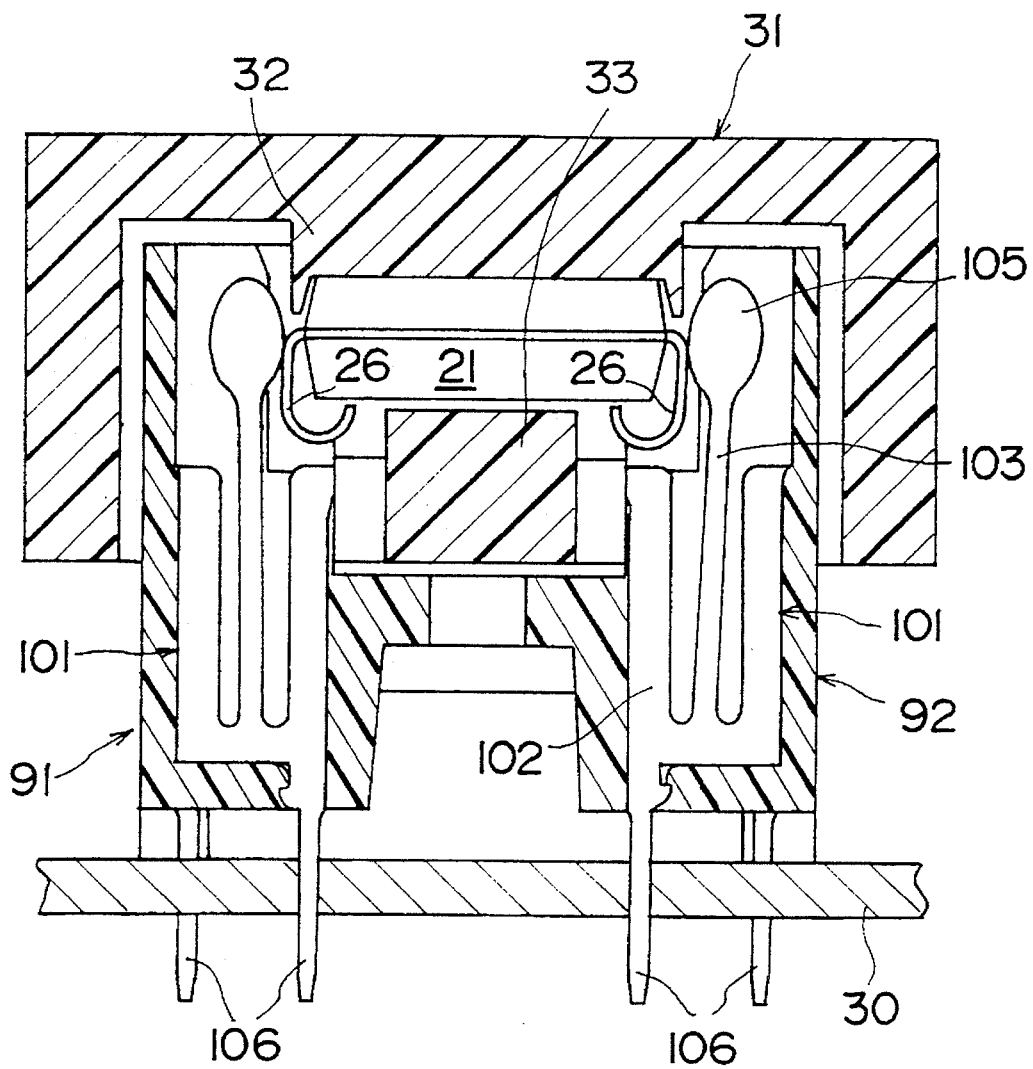
FIG. 1 is a cross sectional view of a prior art socket in which an IC package is mounted and an associated head.

In the case of the socket according to the prior art as shown in FIG. 1, again with a to d representing the load at the respective stages shown in FIGS. 2(a) to 2(d), the contact load increases from the time when each lead 26 has engaged the wide contact portion 105 at the tip of the respective contact portion to the time when the vertically disposed straight line portion of the lead 26 has engaged contact portion 105 (from what is shown in FIG. 2(b) to what is shown in FIG. 2(c)) with the contact load being maintained approximately constant thereafter, finally arriving at the position shown in FIG. 2(d), the position also shown in FIG. 1. This change in contact load is shown by a dashed line in FIG. 4. Since the contact load needed at the completion of mounting is attained when the distance of movement of the IC package is only approximately 40 percent of the total travel, the burden or stress on the contact is high. Moreover, in as much as this contact load is dependent only upon the elasticity of the flexible contact portion 103, the stress on the contact 101 for obtaining the necessary contact load becomes substantially large. Thus, repetitive use causes the fatigue of the flexible contact portion 103.

In view of the fact that the percentage of IC package travel or stroke of head 31 during which the contact load is at 100 percent is high, there tends to develop a problem in that the solder plated layer of the leads is partially peeled off and the peeled off parts tend to adhere to the leads of following IC packages.

In a socket made in accordance with the invention, however, the contact load between contact elements and respective leads is not dependent upon the elasticity of the contact element 11 but rather, the compressive force is due in large part to the rotation of levers 7, with a consequence that the stress placed on the contact elements is minimized and that the contact elements can be subjected to repetitive use without causing fatigue of the flexible portions 13. Moreover, the solder of the leads do not tend to accumulate on the contact portions 15 so as to adhere to the leads of subsequent IC packages.

Next, an outline of the test of the electrical properties of the IC package will be explained with particular reference to FIGS. 17–19. FIG. 17 is a perspective view of a test apparatus 41 called a dynamic test handler. Test apparatus 41 has a control section 45, a measurement and display section 46 and a head driving section 43. Carriage 42 disposed at the top of the head driving section 43 accommodates untested IC packages while container 44 disposed at the bottom thereof accommodates the tested IC packages. Head 31, also shown, for example, in FIG. 5, is connected to the head drive section 43. Carriage 42 and head 31 are connected by a guide rail 47 and head 31 and container 44 are connected by a guide rail 48.

Figure 18:
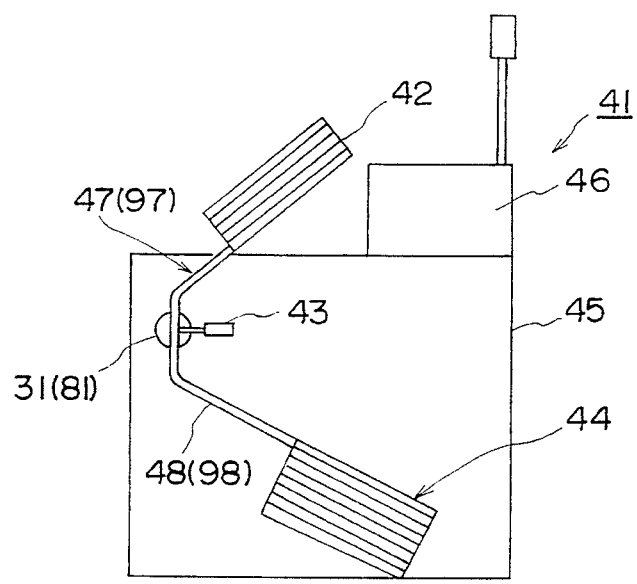
FIG. 18 is a partly schematic left side view of the FIG. 17 IC package testing apparatus.
Figure 19:
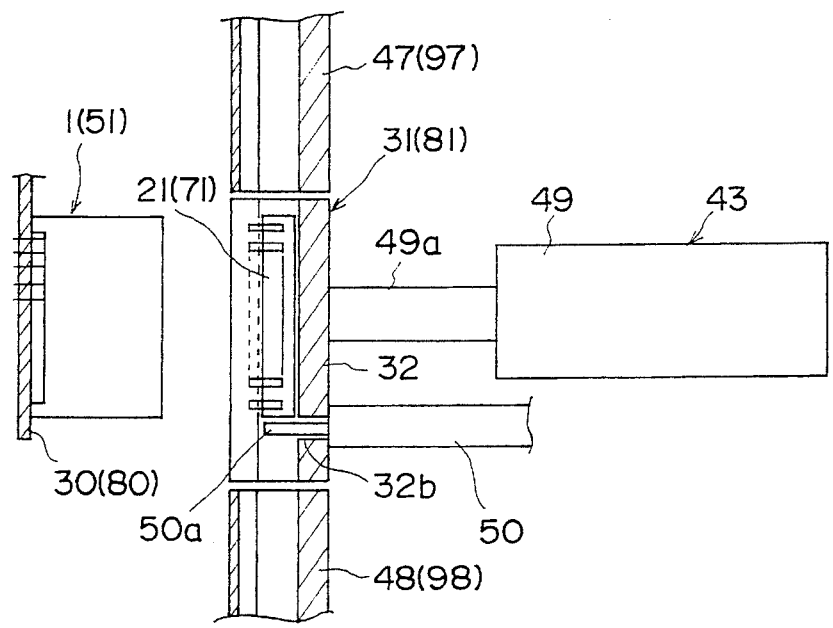
FIG. 19 s an enlarged view of a portion of FIG. 18 with the head in the loading position.

As is shown in FIG. 19, an IC package 21 to be used in the test is supplied to head 31 through guide rail 47 from carriage 42 shown in FIG. 18. Pin 50a which is located below head 31 works as a stop member and IC package 21 stops at a prescribed position inside head 31. Pin 50a is part of a piston rod for a cylinder 50 and is freely removably inserted through hole 32b of head 31. A socket 1, as shown in FIG. 19, is disposed opposite to and aligned with head 31.

Figure 20:
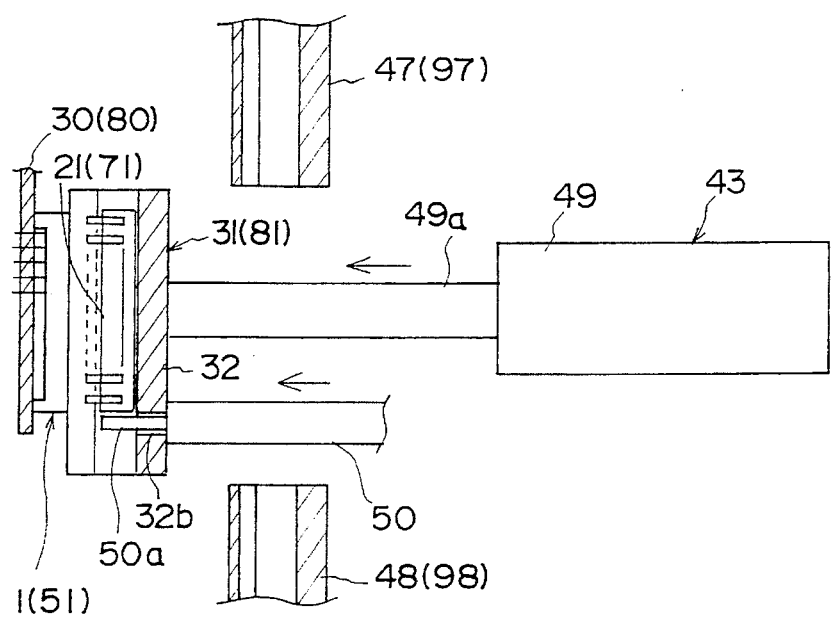
FIG. 20 s a view similar to FIG. 19 in the position in which the IC package is mounted in the socket.
Figure 21:
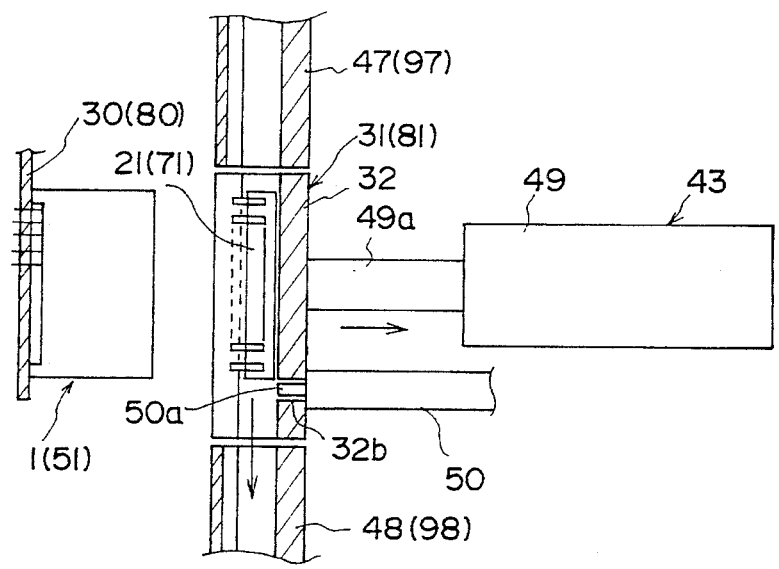
FIG. 21 s a view similar to FIG. 19 in the position of removing the IC package from the socket.
Figure 22:
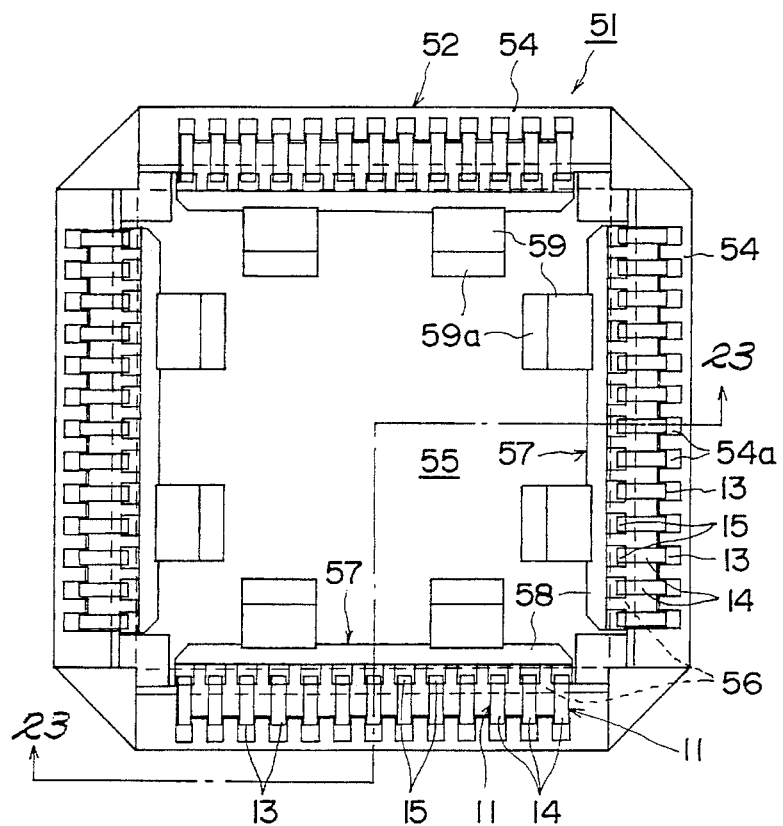
FIG. 22 is a plan view of a socket made in accordance with a second embodiment of the invention.

IC package 21 is mounted in socket 1, which has been oriented vertically with the opening facing to the right side as shown in FIG. 20. In other words, as cylinder 49 of the head driving section 43, is driven, head 31 fixed to piston rod 49a moves forward toward socket 1, with a result that the IC package is mounted in the socket 1 as shown in FIG. 6. At this time, cylinder 50 for the stop member also moves along with the driving of the piston 49a and the pin 50a supports the IC package.

In this position, IC package 21 undergoes a test of its electrical properties by the measuring and displaying section 46 shown in FIGS. 17 and 18. Socket 1 is mounted on vertically disposed PCB 30 with the vertical direction being aligned with the longitudinal direction of the socket.

Upon the completion of the test, cylinder 49 is driven, its piston rod 49a moves back in the opposite direction along with head 31 and IC package 21 to the original positions. In this manner, IC package 21 is removed from socket 1. Next, cylinder 50 for the IC package stop member is driven and pin 50a is removed from head 31. Thereupon, IC package 21 moves down as indicated by an arrow (FIG. 21) inside the guide rail 48 and is received in container 44 shown in FIG. 18. Then, the next IC package is similarly supplied to head 31 as shown in FIG. 19.

The supply of IC packages 21 from carriage 42 to head 31, the driving of cylinders 43 and 50 and the test and measurement and display section 46 are operated by the control section 45 shown in FIGS. 17 and 18.

In the manner described above, a large number of IC packages are mounted in and removed from socket 1, one after another. Even though such mounting and removal may be carried out many times, the flexible contact portion does not tend to become fatigued as described earlier with reference to the prior art, with the test being carried out smoothly without lowering the quality of the IC package.

Figure 23:
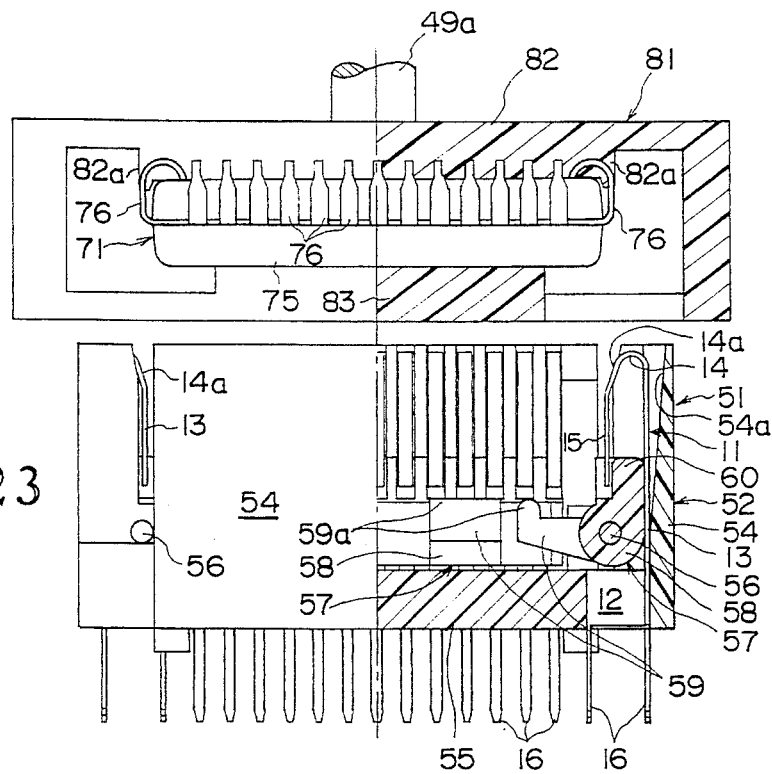
FIG. 23 s a partial cross sectional view taken along line 23—23 in FIG. 22.

With reference to FIGS. 22–25, a second embodiment of the invention is shown for mounting an IC package called the QFJ type, having generally J-shaped leads on all four side surfaces. Socket 51 of the second embodiment is for mounting the IC package which is square in configuration, whose shape and dimensions of each of the side surfaces are same. Since it is symmetrical relative to two central lines that cross each other at a right angle, the cross sectional view of FIG. 23 is shown only for the right side.

Contact element 11 described above in the first embodiment is also used in the second embodiment and the various parts corresponding to the various parts of FIGS. 7 through 9 are identified by the same numeral with the addition of 50. Head 81 is also shown in FIG. 23.

On the four sidewalls of the main body 52 of the socket 51, an inclined surface 54a is formed to provide space for the elastic deformation of the contact elements. Inside the socket relative to each sidewall 54, contact elements 11 are seated with base portion 12 fixedly mounted in bottom wall 55. Thirteen (13) contacts 11 are arranged along each sidewall 54.

A lever 57 is pivotably journaled on shaft 56 along each sidewall 54 and a single arm 59 extends from shaft 58 with a protuberance 59a provided on a distal end of arm 59. An arm 60 for each contact element 11 is provided extending from shaft 58 and is inserted between the flexible portion 13 of contact element 11 and the free end contact portion 15.

As in the case of the first embodiment, the lower terminal face of the bottom IC package support boss 83 of head 81 as seen in FIG. 23 engages protuberances 59a and, when engaged, levers 57 rotate, arms 60 press respective contact portions 15, with a result that the contact portions 15 are electrically connected to respective leads 76 of the IC package 71.

Figure 24:
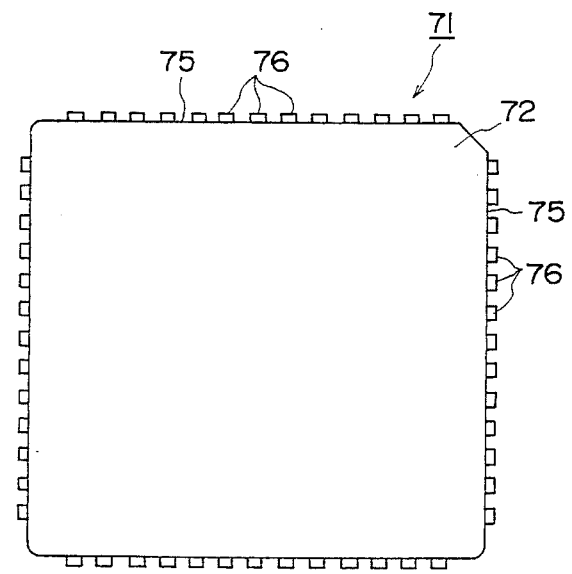
FIG. 24 is a top plan view of the IC package of the QFJ type.
Figure 25:
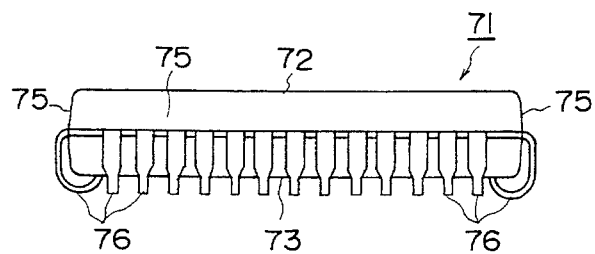
FIG. 25 is a front view of the FIG. 24 IC package.

As shown in FIGS. 24 and 25, IC package 71 is approximately square in shape, with a selected number of leads 76, e.g., 13, which are generally configured as a J being provided on each side surface 75. The back, left and right side views of the IC package 71 are no different from FIG. 25, which shows its front view. Therefore, a description of these will be omitted.

The mechanism of mounting an IC package 71 in socket 51 is also the same as described in the first embodiment, except for the fact that the IC package is oriented upside down to be supported by head 81.

The test apparatus 41 which has been described in connection with FIGS. 17 and 18 can be used in the electrical property test of IC package 71. In view of the fact that the shapes and dimensions of the IC packages are different from those of the IC package in the first embodiment, however, a head, a guide rail and a PCB which correspond to the IC package are used. Reference numerals relating to the second embodiment are expressed in parentheses in FIGS. 18 through 21. In other words, numeral 51 is a socket, 71 is an IC package, 80 is a PCB, 81 is a head, 82 is an upstream side guide rail, and 83 is a downstream side guide rail.

In this embodiment, the same effect is achieved as in the first embodiment.

Although the invention has been described with respect to specific preferred embodiments thereof, variations and modifications will become apparent to those skilled in the art. For example, this invention can be used for test sockets other than those used in the test of electrical properties such as sockets used in burn-in tests. Even in the case of the IC package of the SOJ type, further, the socket can be turned over upside down for mounting as in the case of the IC packages of the QFJ type. In addition, the socket according to the invention can be used in the mounting of IC packages of types other than SOJ and QFJ types. Even the leads of the IC packages can be leads of other various shapes. In such cases, the shape of the contacts can be any suitable shape corresponding to the shape of the leads. In addition, this invention can be used in sockets for mounting of electrical parts other than IC packages. In addition, the lever for the pressing of the contact elements can be any suitable shape which will be in conformity with the shape of the contact, and the direction of rotation can be opposite to that which has been described above. Levers other than those that rotate with the shaft as a fulcrum may also be used as the operating members using some other mechanism.

It is the intention that the appended claims be interpreted as broadly as possible in view of the prior art to include all such variations and modifications. Since, according to the invention, the operating member presses contact elements at the end of the mounting stroke of the electrical part, the contact elements press the electrical part because of this pressing, thereby effecting an electrical connection between the contact element and the electrical part, there are obtained the following effects:

As the electrical connection between the contact elements and the electrical parts are effected as the contact elements press the electrical part by the pressing of the operating member, the mechanism for the electrical connection becomes simple. In addition, since the contact elements pressed by the operating member is made to directly work on the electrical part, the electrical connection can be carried out quickly without merely depending upon the spring return force of the contact maker.

Along with the progress of the pressing of the contacts against the electrical part in conformity with the operation of the operating member, moreover, this pressing force reaches the necessary pressing pressure of the contact elements against the electrical part essentially at the completion of the mounting of the electrical part.

Since the stress burden for the electrical part pressing of the contact elements is mitigated as a result of the above, the durability of the contact maker improves and, at the same time, the electrical part will not be damaged by the contact elements, thereby preventing any lowering of the quality of the electrical part.

What is claimed:

1. Socket apparatus for mounting IC units having a plurality of leads comprising, a body member having a center and having opposed sides, a plurality of contact elements mounted on at least one opposed side of the body member aligned with respective leads of an IC unit to be received therein, each contact element having a flexible, elongated contact portion having a first surface facing the center of the body member and a second opposite surface facing away from the center of the body member, a lever means pivotably mounted in the body member and having a first arm disposed in alignment with each contact portion on a side of the contact portion facing the second, opposite surface, the lever means having a second arm with a distal end portion, a movable head member movable between a first IC unit loading position and a second IC unit mounting position, the head member having an IC unit receiving seat, IC leads of an IC unit disposed on the IC unit receiving seat moving into engagement with the first surface of respective contact portions as the head member moves from the first position toward the second position applying a first contact force on the leads, the head member engaging the distal end portion of the second arm when the head member is proximate to the second IC mounting position so that continued movement of the head member to the second IC mounting position causes the lever means to pivot concomitantly moving the first arms against the second surface of respective contact portions and toward respective IC unit leads applying a second force on each IC unit lead for a total contact loading at the mounting position.

2. Socket apparatus according to claim 1 in which each contact element is generally U-shaped having first and second legs joined by a bight portion, the first leg being mounted on the body member and the second leg forming the flexible, elongated contact portion.

3. Socket apparatus according to claim 2 in which the first arms of the lever means are sandwiched between first and second legs of respective contact elements.

4. Socket apparatus according to claim 1 in which the contact elements-are mounted on opposed sides of the body member.

5. Socket apparatus according to claim 4 in which the lever means includes a lever element provided for the contact elements of each opposed side.

6. Socket apparatus according to claim 1 in which the first contact force comprises approximately 40 percent of the total contact loading at the mounting position.

7. Socket apparatus according to claim 1 in which the second contact force comprises approximately 60 percent of the total contact loading at the mounting position.

8. Socket apparatus according to claim 6 in which the second contact force comprises approximately 60 percent of the total contact loading at the mounting position.

9. Socket apparatus according to claim 2 in which an inclined surface portion is formed between each contact portion and the respective bight portion.

10. Socket apparatus for mounting electric parts having a plurality of leads comprising, a body member having a center and having opposed sides, a plurality contact elements mounted in opposed sides of the body member aligned with respective leads of an electric part to be received therein, each contact element having a flexible, elongated contact portion, a one piece lever means pivotably mounted in the base member and having a first arm means disposed in alignment with each contact portion and second arm means having a distal end portion, the second arm means being oriented at a substantial angle to the first arm means, a movable head member movable between a first electrical part loading position and a second electric part mounting position, the head member having an electric part receiving seat, the head member engaging the distal end portion of the second arm means at a location of the head member proximate to the second electric part mounting position causing the one piece lever means to pivot concomitantly moving the first arm means against respective contact portions and biasing the contact portions against respective electric part leads applying a force on the electric part leads at the second mounting position.

11. Socket apparatus for mounting IC units having a plurality of leads on opposed sides thereof comprising, a body member having opposed sides, a contact element for each IC lead mounted in the body member in alignment with leads of an IC unit received in the socket, each contact element having a generally U-shaped flexible portion comprising a first leg extending upwardly from the body member, a curved bight and a second leg extending downwardly forming a contact portion, a lever means pivotably mounted in the body member adjacent each opposed side of said body member, each lever mean comprising a first arm received between the first and second leg of respective ones of said contact elements and a second arm having a distal end, a movable head member movable between an upper IC unit loading position and a lower IC unit mounting position, the head member having an IC unit receiving seat, each lead of an IC unit disposed on the IC unit receiving seat moving into engagement with the second leg of a respective contact element as the head member moves from the first IC unit loading position to the second IC unit mounting position applying a first force to each respective IC unit lead, the head member engaging the distal end of the second arm at a location of the head member proximate to second IC unit mounting position and upon continued movement of the head member to the second IC unit mounting position causing each lever means to pivot concomitantly moving each first arm against a respective second leg and applying a second force to each respective IC unit lead through the contact portion of the respective second leg.

12. Socket apparatus according to claim 11 in which the second leg of each contact element has a portion extending from the bight to the remainder of the second leg which forms an oblique angle with the remainder of the second leg.

* * * * *